(12) United States Patent
Lavitsky et al.

(10) Patent No.: US 11,618,943 B2
(45) Date of Patent: Apr. 4, 2023

(54) PVD TARGET HAVING SELF-RETAINED LOW FRICTION PADS

(71) Applicant: Applied Materials, Inc., Santa Clara, CA (US)

(72) Inventors: Ilya Lavitsky, San Francisco, CA (US); Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 116 days.

(21) Appl. No.: 17/078,383

(22) Filed: Oct. 23, 2020

(65) Prior Publication Data

US 2022/0127714 A1    Apr. 28, 2022

(51) Int. Cl.
    *C23C 14/34* (2006.01)
(52) U.S. Cl.
    CPC ................. *C23C 14/3414* (2013.01)
(58) Field of Classification Search
    CPC .............................................. C23C 14/3414
    See application file for complete search history.

(56) References Cited

U.S. PATENT DOCUMENTS

| | | | |
|---|---|---|---|
| 5,666,691 A * | 9/1997 | Bealing | B60N 3/046 16/4 |
| 6,190,513 B1 | 2/2001 | Forster et al. | |
| D706,362 S | 6/2014 | Norman et al. | |
| 9,960,021 B2 | 5/2018 | Riker et al. | |
| 2003/0089601 A1 | 5/2003 | Ding et al. | |
| 2006/0070878 A1 | 4/2006 | Wu et al. | |
| 2008/0164146 A1 | 7/2008 | Ivanov et al. | |
| 2015/0170888 A1 * | 6/2015 | Riker | H01J 37/3423 204/298.12 |
| 2021/0033132 A1 * | 2/2021 | Sin Yan Too | F16B 19/004 |

OTHER PUBLICATIONS

International Search Report for PCT/US2021/062150, dated Dec. 24, 2021.

* cited by examiner

*Primary Examiner* — John J Brayton
(74) *Attorney, Agent, or Firm* — Moser Taboada (57) ABSTRACT

Embodiments of target assemblies for use in substrate processing chambers are provided herein. In some embodiments, a target assembly includes a plate comprising a first side including a central portion and a support portion, a target disposed on the central portion, a plurality of recesses formed in the support portion; and a plurality of self-retained low-friction pads partially disposed in the plurality of recesses, wherein each of the plurality of low-friction pads includes a solid body portion, and a self-retaining stem that extends outward from a bottom of the solid body portion, wherein the self-retaining stem includes a first stem portion disposed in the first through-hole portion, and a second stem portion disposed within the second through-hole portion.

17 Claims, 5 Drawing Sheets

PVD TARGET HAVING SELF-RETAINED LOW FRICTION PADS

FIELD

Embodiments of the present invention generally relate to semiconductor processing equipment.

BACKGROUND

Physical vapor deposition (PVD) is commonly utilized for forming thin layers of material on substrates, for example semiconductor substrates. A sputtering target, usually including a backing plate, is provided proximate to a substrate within an appropriate chamber and forming an upper portion of a PVD sputter chamber. The backing plate often rests on a ceramic insulating ring. In some processes, the temperature of the target and the chamber increases during processing thermal expansion of the target backing plate and the chamber wall. The thermal expansion of the target backing plate and the chamber wall may be different, and have been observed by the inventors to cause the target backing plate and the insulating ring to move relative to each other, causing friction. The friction has been observed to cause the backing plate and the insulating ring to grind together, causing portions of the backing plate to wear at the interface. The worn material may contaminate the chamber.

Accordingly, the inventors have provided a target assembly that may advantageously reduce the friction at an interface between the target and the PVD chamber using self-retained low friction pads on a target backing plate.

SUMMARY

Embodiments of target assemblies for use in substrate processing chambers are provided herein. In some embodiments, a target assembly includes a plate comprising a first side including a central portion and a support portion, a target disposed on the central portion, a plurality of recesses formed in the support portion; and a plurality of self-retained low-friction pads partially disposed in the plurality of recesses, wherein each of the plurality of low-friction pads includes a solid body portion, and a self-retaining stem that extends outward from a bottom of the solid body portion, wherein the self-retaining stem includes a first stem portion disposed in the first through-hole portion, and a second stem portion disposed within the second through-hole portion.

In some embodiments, a target assembly for a substrate processing chamber includes a plate comprising a first side including a central portion and a support portion, wherein the central portion is configured to support target source material, a plurality of recesses formed in the support portion, wherein each of the plurality of recesses includes a first through-hole portion having a first diameter, and a second through-hole portion having a second diameter that is larger than the first diameter of the first through-hole, and a plurality of low-friction pads partially disposed in the plurality of recesses, wherein each of the plurality of low-friction pads includes a solid body portion, and a self-retaining stem that extends outward from a bottom of the solid body portion, wherein the self-retaining stem includes a first stem portion disposed in the first through-hole portion, and a second stem portion disposed within the second through-hole portion.

In some embodiments, a self-retained low-friction pad for use in a target assembly for a substrate processing chamber may include a solid body portion, and a self-retaining stem that extends outward from a bottom of the solid body portion, wherein the self-retaining stem includes a first stem portion disposed in the first through-hole portion; and a second stem portion disposed within the second through-hole portion, wherein the second stem portion includes a claw portion that is wider than the first diameter of the first stem portion along at least one direction, wherein the self-retaining stem includes at least one slot configured to allow the self-retaining stem to be compressed.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for embodiments of the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of target assemblies for use in substrate processing chambers, such as for a physical vapor deposition (PVD) chamber, are provided herein. The inventive target assemblies may advantageously reduce friction between the target assembly and a support member of the process chamber that supports the target assembly. The reduction in friction may beneficially reduce wear of the support member or the target assembly and advantageously reduce contamination of the chamber by the worn material. In addition, the inventive low-friction pads described herein are self-retained which eliminate the need for an external fastener to secure the pad to the backing plate. This advantageously allows for an increase in bearing surface area of the pads, thus reducing the total numbers of pads required provide a low-friction bearing surface as compared to pads that include external fasteners.

Figure 1:
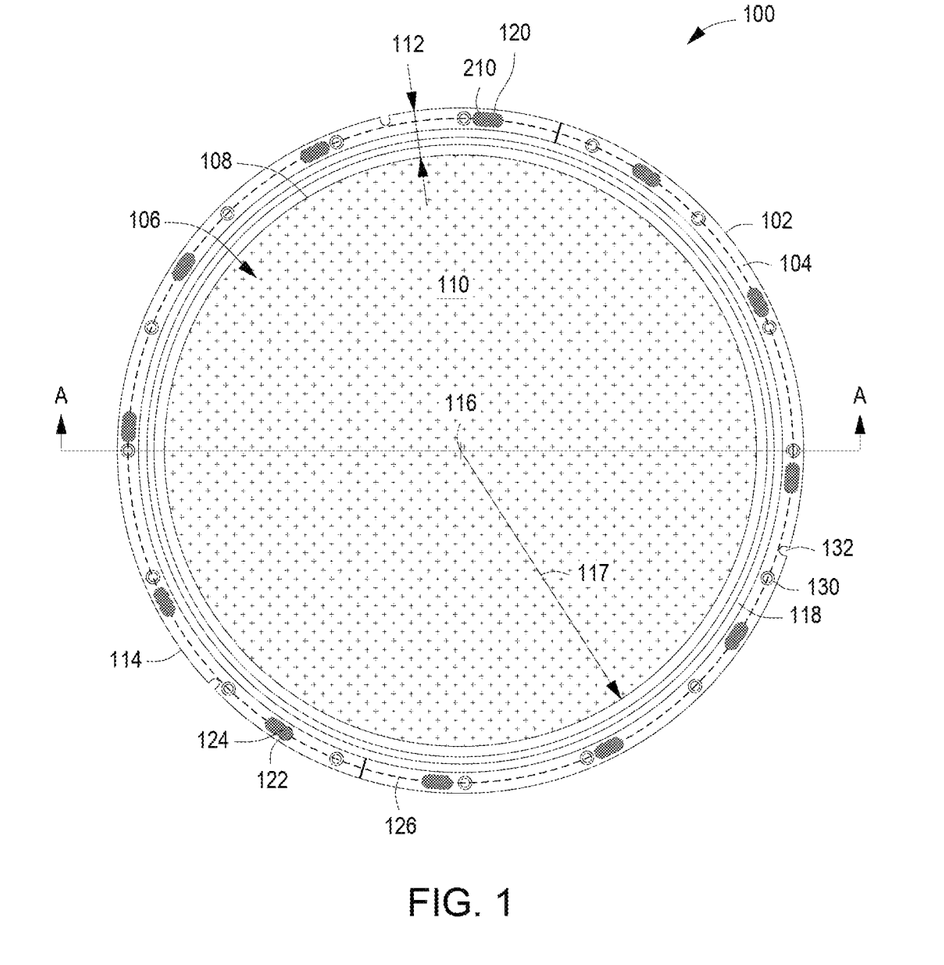
FIG. 1 depicts a bottom view of a target assembly in accordance with some embodiments of the present invention.

Embodiments of the invention may be better understood with simultaneous reference to FIGS. 1, 2A-2D, and 3A-3F in which FIG. 1 is a bottom view and FIG. 2 is a side sectional view.

FIG. 1 depicts a bottom view of a target assembly 100 in accordance with embodiments of the present invention. Target assembly 100 may be used with any suitable substrate processing chamber, for example any of the ENDURA® models of physical vapor deposition (PVD) chambers available from Applied Materials, Inc., of Santa Clara, Calif. An exemplary PVD chamber including target assembly 100 is described below with respect to FIG. 4. The apparatus described herein may also be beneficially used with other process chambers. The target assembly 100 may be advantageously used with chambers configured to process 200 mm, 300 mm, or 450 mm diameter substrates, although chambers configured to process other size substrates may similarly benefit.

The target assembly 100 includes a target backing plate 102 having a first side 104 comprising a central portion 106 and a support portion 112. The target assembly 100 includes a source material 108 to be deposited on a substrate. The source material 108 is centrally disposed on the backing plate 102, extending from a central position corresponding to central point 116 to a first radial position 117. The source material 108 includes a sputtering surface 110 raised (outwardly offset) from and directed away from the backing plate 102. In some embodiments, the source material 108 may be affixed to the first side 104 using an appropriate bonding process, for example diffusion bonding, or mechanically attached to the backing plate 102. Although referred to as an assembly, the target assembly 100 may be a monolithic member. For example, in some embodiments, the source material 108 and the backing plate 102 may be integrally formed from the same material.

The support portion 112 is disposed radially outward from the central portion 106 and extends outward, in some embodiments to the outer perimeter 114, at a distance R1 from a central point 116 of the backing plate 102. The support portion 112 may include a channel or o-ring groove, groove 118, circumscribing the central portion 106 and centrally located at a distance R2 from the central axis 204 through central point 116. The groove 118 is configured to retain a sealing element (sealing element 290 in FIGS. 2D and 4), such as an o-ring or gasket, to facilitate formation of a seal with a portion of a chamber, for example with in insulating ring of a PVD chamber. The groove 118 may be a square groove as shown, or may be of any other shape, including as non-limiting examples semicircular or dovetail (i.e., the sidewalls of the groove diverge and the base is larger than the opening).

The groove 118 separates the support portion 112 into an atmospheric side 206 radially outward from the groove 118 and a vacuum side 208 radially inward from the groove 118. The vacuum portion may extend to the central axis 204 and includes the central portion 106 of the backing plate 102 and the source material 108.

A plurality of recesses 120 are formed in in the atmospheric side 206 of the support portion 112, through the first side 104 and partially through the thickness T of the backing plate 102. As illustrated in FIG. 1, 12 equally spaced recesses 120 are formed in the backing plate 102. In other embodiments, a greater number or a lesser number (e.g., 6-36 pads) may also be formed which may or may not be equally spaced apart. In some embodiments, the number of recesses and corresponding pads 210 used are dependent on the bearing surface 212 area of the pads required or desired.

The recesses 120 are illustrated to be of a similar size and of the same, or similar, rectangular cross-section for ease of illustration only. In embodiments where the recesses 120 are rectangular, the recesses 120 may be evenly spaced apart angularly around the plate and aligned along a circular path 126 (shown as a dashed line) centered at the central axis 204 such that the longitudinal axis 122 of each of the rectangular recesses is tangent at the midpoint 124 of the axis 122 to the circular path 126. The longitudinal axis 122 may be a major axis, i.e., the axis parallel to the longer sides of the recess 120. The size and number of recesses may be chosen such that the sum of the axial lengths, i.e., the total axial length, of each longitudinal axis 122 of the plurality of recesses is between about 25% and about 75%, for example about 50%, of the length of the circular path to which the recesses 120 are aligned.

In some embodiments, the recesses 120 may be oblong. Other cross-sectional shapes may be used for the recesses 120, including as non-limiting examples, arcuate (i.e., have an arcuate cross section), circular, oval, pentagonal, or other curvilinear or polygonal shapes.

In some embodiments, the backing plate 102 may include a plurality of backing plate fastener holes 130 for securing the backing plate to a support structure in a process chamber. In some embodiments, the backing plate 102 may also include a plurality of alignment tabs 132 for properly aligning the backing plate within the process chamber during installation.

Figure 2A:
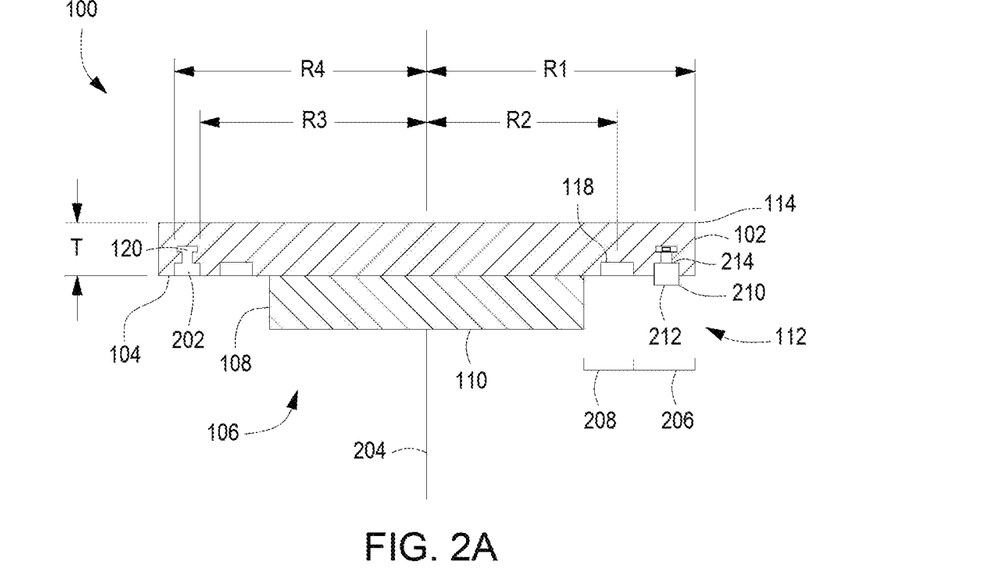
FIG. 2A depicts a sectional view of the target assembly of FIG. 1 taken along line A-A.

As illustrated in FIG. 2A, a pad 210 is disposed in a recess 120 such that a bearing surface 212 of the pad 210 is spaced above the surface of the first side 104. A seating surface 214 of the pad 210 is supported by the bottom surface 202 of the recess 120 against further displacement into the backing plate 102. Only one pad 210 is shown for clarity although pads 210 are disposed about the target assembly 100 in sufficient number to support the target assembly 100 as described herein. In some embodiments, a pad 210 is partially disposed in each of the plurality of recesses 120. In other embodiments, a pad 210 is disposed in some of the recesses 120, for example in alternating recesses or in some other pattern of recesses. In some embodiments of the present invention, the bearing surface 212 is spaced above the first side 104 by about 0.05 mm to about 1 mm, for example about 0.75 mm.

Figure 2B:
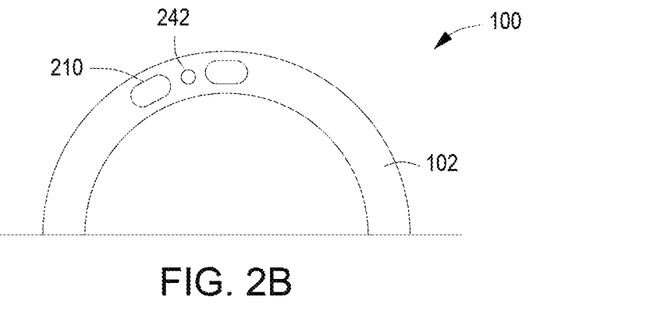
FIG. 2B depicts a partial bottom view of a target assembly in accordance with some embodiments of the present invention.

As shown in FIG. 2B, one or more pads 210 may be disposed proximate a backing plate fastener 242 disposed through the plurality of fastener holes 130 that secures the backing plate to the process chamber in some embodiments, for example, on both sides of backing plate fastener 242. The pads 210 may alternatively or in combination be disposed in other locations along the backing plate 102.

Figure 2C:
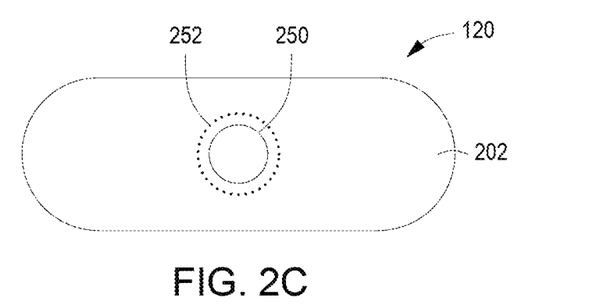
FIG. 2C depicts a top view of a contact pad recess formed in a target assembly for receiving a contact pad in accordance with some embodiments of the present invention.
Figure 2D:
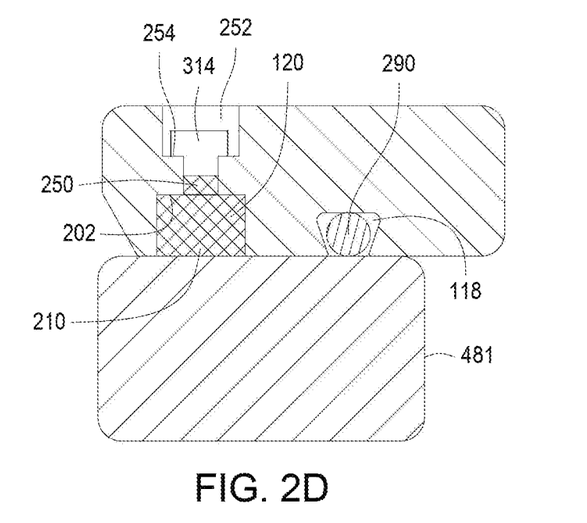
FIG. 2D depicts a cross-sectional side view of the backing plate showing the contact pad recess for receiving a contact pad shown in FIGS. 3A-3E.

FIGS. 2C and 2D are top and cross-sectional side views, respectively, of an exemplary pad recess 120. As shown in FIG. 2C, the pad recess includes a bottom surface 202 that supports seating surface 214 of the pad 210. The pad recess 120 further includes a first through-hole portion 250 having a first diameter, and a second through-hole portion 252 having a second diameter that is larger than the first diameter of the first through-hole 250. In some embodiments, the second through-hole portion 252 extends entirely through the backing plate 102 as shown in FIG. 2D. In other embodiments, the second through-hole portion 252 does not extend entirely through the backing plate 102 as shown in FIG. 2A.

In some embodiments, each of the pads is secured in a corresponding recess 120 using a self-retaining shaft or stem 302 that extends outward from a bottom of the solid body portion 310 of the pad as shown in FIGS. 3A-3D. The self-retaining stem 302 includes a first stem portion 304 that is configured to be disposed within the first through-hole portion 250. The self-retaining stem 302 includes a second stem portion 306 that is configured to be disposed within the second through-hole portion 252.

Figure 3A:
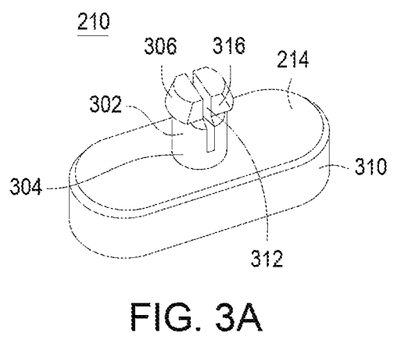
FIG. 3A depicts an isometric view of a contact pad in accordance with some embodiments of the present invention.
Figure 3B:
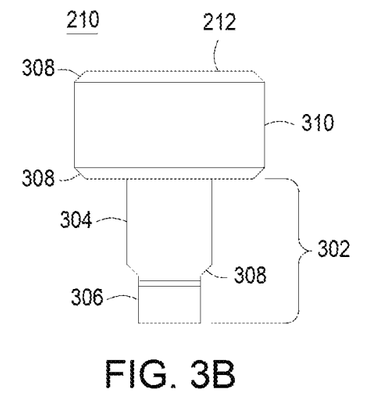
FIG. 3B depicts a left and/or right view of a contact pad in accordance with some embodiments of the present invention.
Figure 3C:
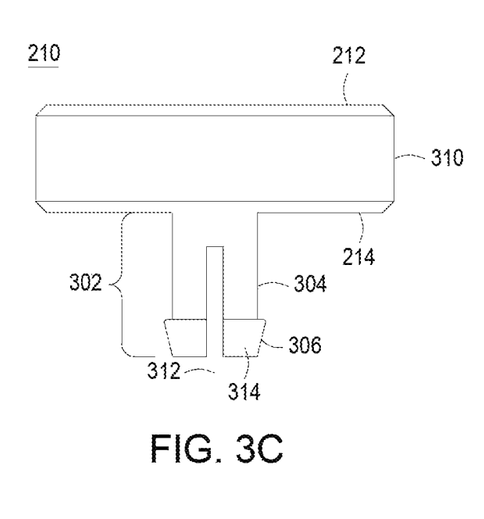
FIG. 3C depicts a front and/or back view of a contact pad in accordance with some embodiments of the present invention.
Figure 3D:
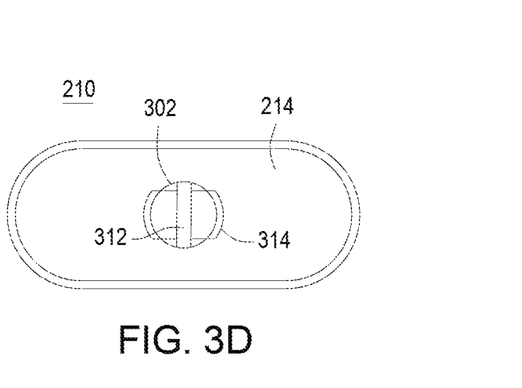
FIG. 3D depicts a bottom view of a contact pad in accordance with some embodiments of the present invention.
Figure 3E:
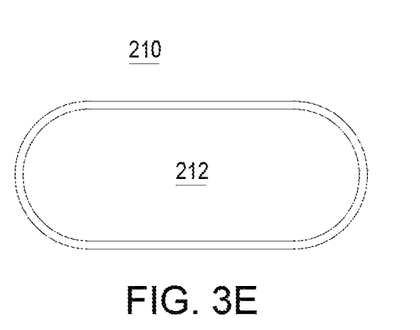
FIG. 3E depicts a top view of a contact pad in accordance with some embodiments of the present invention.
Figure 3F:
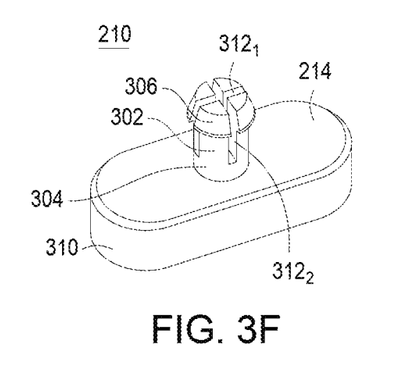
FIG. 3F depicts an isometric view of a contact pad in accordance with some embodiments of the present invention.

The second stem portion 306 includes a clamping or claw portion 314 that is wider than the diameter of the first stem portion 304 along a first direction. In some embodiments, the claw portion 314 is cut flat on two sides such that the width of the cut side 316 is narrower than the diameter of the of the first stem portion 304. The self-retaining stem 302 also includes a slot 312 that allows the stem to be squeezed/compressed to allow the second stem portion 306 along with its claw portion 314 to fit though the second through-hole portion 252. In some embodiments, as shown in FIG. 3F, more the one slot (e.g., 2, 3, 4 or more slots) may be formed in the self-retaining stem 302 to allow the stem to be squeezed/compressed to allow the second stem portion 306 along with its claw portion 314 to fit though the second through-hole portion 252. Once the second stem portion 306 along with its claw portion 314 is disposed in the second through-hole portion 252, the claw portion 314 springs out and grips, catches, or otherwise comes in contact with retaining surface 254 (shown in FIG. 2D) which retains the pad 210 within pad recess 120 and secures the pad 210 to the backing plate 102.

In some embodiments, the pads 210 have an oblong shape. In other embodiments, the pads 210 may have a rectangular, circular, ovular, or other type of shape. In some embodiments, the bearing surface area of each pad bearing surface 212 may be about 0.20 square inches to about 0.35 square inches. In some embodiments, the number of recesses and corresponding pads 210 used are dependent on the bearing surface area of the pads required or desired.

In some embodiments, the pads 210 are chamfered to form a guiding chamfer 308 at the each of the corners or edges to avoid any sharp corners. The chamfers on the solid body portion 310 advantageously provide a well-defined sliding bearing surface. Meanwhile, the chamfers along the self-retaining stem 302 helps avoid any corner interference and provides a more solid support in additional to helping with installation by allowing the pads 210 and the self-retaining stem 302 to more easily fit though the first and second through holes 250, 252.

The pads may be any color available. However, in some embodiments, the color of the pads 210 beige, light brown, tan or other light color to avoid black marking caused by dark colored pads.

In some embodiments, the pads 210 are individually removable from the recesses 120, for example, to replace a damaged pad. A removed pad may be easily replaced at a low cost with a replacement pad of the same configuration as pad 210 and press fit into the recess 120 using any appropriate method, including manually.

The pads 210 are formed from a process compatible material that has a low coefficient of friction and a high yield strength to withstand and vacuum forces or other substrate processing environment loads. Some non-limiting examples of materials that may be used for the pads include as ultra-high-molecular-weight polyethylene (UHMWPE), polyether ether ketone (PEEK), polytetrafluoroethylene (PTFE), acetal homopolymer resins such as DELRIN®, and the like.

The inventors have observed a transfer of material between the insulating ring and the target in conventional PVD chambers. The transferred material is understood to be the result of friction, and resulting grinding, between a support member of the process chamber, such as the seal ring 481 described below with respect to FIG. 4, and the target assembly 100 due to movement between the two components resulting from, among other things, thermal load and vacuum load. The grinding also has been observed to abrade material from one or both of the components. The abraded material may enter and contaminate the chamber during processing. The contamination has been observed to cause, among other things, arcing in the chamber and the associated negative impact on processing results.

The inventors have observed that reduced friction between the target and the insulator ring can reduce the abrasion and transfer of materials. Target assemblies in accordance with embodiments of the present invention reduce friction between the two components in a number of ways. The individual pads spaced apart from each other provide discrete contact points between the insulator ring and the target. Materials selected for the pads may be any material with appropriate mechanical properties, including, for example, heat resistance, coefficient of friction, and working strength. A target including pads formed from a material having a working strength appropriate for the application, and a low coefficient of friction (such as UHMWPE, PEEK, PTFE, and acetal homopolymer resins), has been observed to reduce the friction force compared to a target not including the inventive pads.

The inventive pads provide contact at limited points, reducing the sources of friction to only those contact points. In the areas of the support portion of the target not including the inventive pads, the target and the insulator ring remain spaced apart and provide no friction force. By minimizing contact to the individual pads, friction is reduced as compared to, for example, a ring separating the support member and the target assembly.

The inventors have also observed that it is easier to maintain a close tolerance with the individual inventive pads as compared to a complete ring. Maintaining the close tolerance may facilitate improved sealing of the target assembly 100 to a chamber. The inventors have also noted that the recesses 120 and pads 210 may be consistently sized for current chamber sizes (i.e., chambers for processing 200, 300, and 450 mm diameter substrates). The individual pads may also be compatible with future size chambers. In addition, the individual pads are easier to install and maintain as compared to a ring.

Figure 4:
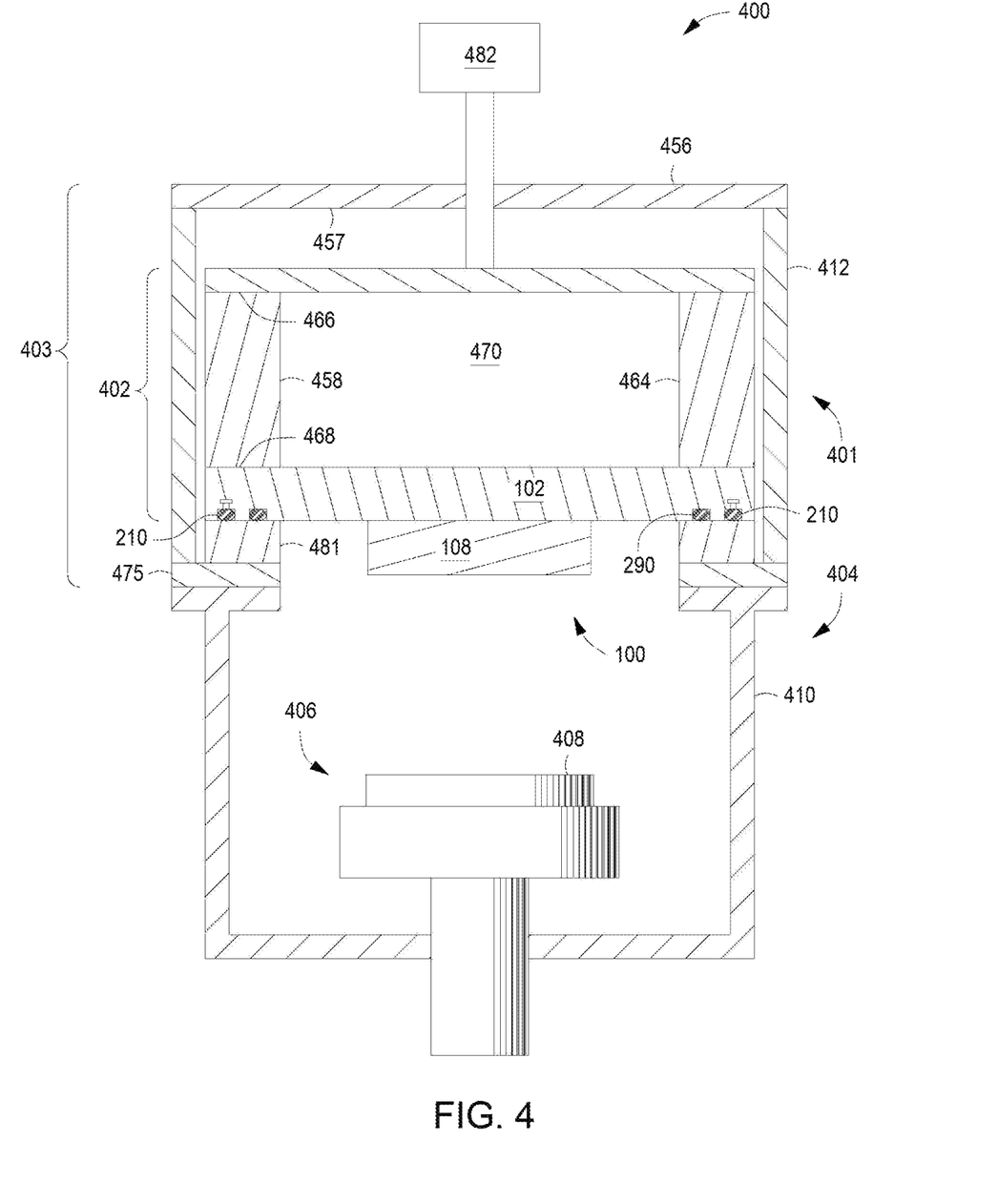
FIG. 4 depicts a process chamber having a target assembly in accordance with some embodiments of the present invention.

FIG. 4 depicts a simplified schematic cross-sectional view of a physical vapor deposition (PVD) chamber 400 having a target assembly 100 in accordance with embodiments of the present invention.

In some embodiments of the present invention, the PVD chamber 400 includes a chamber lid 401 disposed atop a process chamber 404 and removable from the process chamber 404. The chamber lid 401 may include an inner assembly 402 and an outer grounding assembly 403. The process chamber 404 contains a substrate support 406 for receiving a substrate 408 thereon. The substrate support 406 may be located within a lower grounded enclosure wall 410, which may be a chamber wall of the process chamber 404. The lower grounded enclosure wall 410 may be electrically coupled to the grounding assembly 403 of the chamber lid 401 such that an RF return path is provided to an RF power source 482 disposed above the chamber lid 401.

The chamber lid 401 generally includes the grounding assembly 403 disposed about the inner assembly 402. The grounding assembly 403 may include a grounding plate 456 having a first surface 457 that may be generally parallel to and opposite a backside of the inner assembly 402. A grounding shield 412 may extending from the first surface 457 of the grounding plate 456 and surround the inner assembly 402. The grounding assembly 403 may include a support member 475 to support the inner assembly 402 within the grounding assembly 403.

The inner assembly 402 may include a source distribution plate 458 opposing a backside of the target assembly 100 and electrically coupled to the target assembly 100 along a peripheral edge of the target assembly 100. As discussed above, the target assembly 100 may comprise a source material 108 to be deposited on a substrate, such as the substrate 408 during sputtering. The source material 108 may be comprised of metal, metal oxide, metal alloy, or the like. In some embodiments, the target assembly 100 includes a backing plate 102 to support the source material 108. The source material 108 may be disposed on a substrate support facing side of the backing plate 102 as illustrated in FIG. 4. The backing plate 102 may comprise a conductive material, such as copper, copper-zinc, copper-chrome, or the same material as the target, such that RF and DC power can be coupled to the source material 108 via the backing plate 102. Alternatively, the backing plate 102 may be non-conductive and may include conductive elements (not shown) such as electrical feedthroughs or the like. The backing plate 102 includes a groove 118 to retain sealing element 490, and one or more recesses 120 to retain pad(s) 210.

In some embodiments, the support member 475 may be coupled to a lower end of the grounding shield 412 proximate an outer peripheral edge of the support member 475 and extends radially inward to support a seal ring 481, and the inner assembly 402. The seal ring 481 may be a ring or other annular shape having a desired cross-section. The seal ring 481 may include two opposing planar and generally parallel surfaces to facilitate interfacing with backing plate 102 of target assembly 100 of the inner assembly 402, on a first side of the seal ring 481 and with the support member 475 on a second side of the seal ring 481. The seal ring 481 may be made of a dielectric material, such as ceramic. The seal ring 481 may insulate the inner assembly 402 from the ground assembly 403. The seal ring 482 interfaces with backing plate 102 via the bearing surfaces 212 of pads 210. In addition, the sealing element 490 disposed in groove 118 of backing plate 102 also contacts seal ring 481 to form a vacuum seal between backing plate 102 and seal ring 481.

A conductive member 464 may be disposed between a source distribution plate 458 and the backside of the target assembly 100 to propagate RF energy from the source distribution plate to the peripheral edge of the target assembly 100. The conductive member 464 may be cylindrical, with a first end 466 coupled to a target-facing surface of the source distribution plate 458 proximate the peripheral edge of the source distribution plate 458 and a second end 468 coupled to a source distribution plate-facing surface of the target assembly 100 proximate the peripheral edge of the target assembly 100. In some embodiments, the second end 468 is coupled to a source distribution plate facing surface of the backing plate 102 proximate the peripheral edge of the backing plate 102. In some embodiments, the backing plate 102 may be coupled to the second end 468 of conductive member 464 via one or more fasteners.

The inner assembly 402 may include a cavity 470 disposed between the backside of the target assembly 100 and the source distribution plate 458. The cavity 470 may at least partially house a magnetron assembly. The cavity 470 is at least partially defined by the inner surface of the conductive member 464, a target facing surface of the source distribution plate 458, and a source distribution plate facing surface (e.g., backside) of the target assembly 100 (or backing plate 102). In some embodiments, the cavity 470 may be at least partially filled with a cooling fluid, such as water ($H_2O$) or the like.

While the foregoing is directed to embodiments of the present invention, other and further embodiments of the invention may be devised without departing from the basic scope thereof.

The invention claimed is:

1. A target assembly for a substrate processing chamber, comprising:
    a plate comprising a first side including a central portion and a support portion, wherein the central portion is configured to support target source material; a plurality of recesses formed in the support portion, wherein each of the plurality of recesses includes a first through-hole portion having a first diameter, and a second through-hole portion having a second diameter that is larger than the first diameter of the first through-hole; and
    a plurality of low-friction pads partially disposed in the plurality of recesses, wherein each of the plurality of low-friction pads includes:
        a solid body portion; and
        a self-retaining stem that extends outward from a bottom of the solid body portion, wherein the self-retaining stem includes a first stem portion disposed in the first through-hole portion, and a second stem portion disposed within the second through-hole portion.

2. The target assembly of claim 1, wherein the plurality of recesses are circumferentially spaced around the plate.

3. The target assembly of claim 1, wherein the plurality of recesses are similarly sized.

4. The target assembly of claim 1, wherein the second stem portion includes a claw portion that is wider than the first diameter of the first stem portion along a first direction.

5. The target assembly of claim 4, wherein the claw portion is flat on two sides in a second direction perpendicular to the first direction, such that a width of the flat sides is narrower than the first diameter of the of the first stem portion.

6. The target assembly of claim 4, wherein the self-retaining stem includes at least two slots configured to allow the self-retaining stem to be compressed to allow the second stem portion to fit though the second through-hole portion.

7. The target assembly of claim 6, wherein the claw portion comes in contact with a retaining surface withing the second through-hole portion configured to retain the pad within the recess.

8. The target assembly of claim 1, wherein each of the plurality of low-friction pads includes a bearing surface.

9. The target assembly of claim 8, wherein a surface area of the bearing surface of each of the plurality of low-friction pads is about 0.20 square inches to about 0.35 square inches.

10. The target assembly of claim 1, wherein each of the plurality of low-friction pads are chamfered at the corners of the solid body portion.

11. The target assembly of claim 1, wherein each of the plurality of low-friction pads comprise a seating surface and a bearing surface, wherein, when the seating surface is supported on a bottom surface of a recess, the bearing surface is spaced above the first side of the plate.

12. The target assembly of claim 11, wherein the bearing surface is spaced about 0.05 mm to about 1 mm above the first side.

13. The target assembly of claim 1, wherein the plate includes a groove separating the support portion into an atmospheric side radially outward from the groove and a vacuum side radially inward from the groove.

14. The target assembly of claim 13, wherein the plurality of recesses are formed in the atmospheric side.

15. The target assembly of claim 1, wherein the plurality of low-friction pads are replaceable low-friction pads.

16. The target assembly of claim 1, wherein the plurality of low-friction pads are formed from one or more of ultra-high-molecular-weight polyethylene or polyether ether ketone.

17. A substrate processing apparatus, comprising:
   a chamber body;
   a lid disposed atop the chamber body;
   a target assembly coupled to the lid, the target assembly including
   a backing plate having a first side and an opposing second side, wherein the first side of the backing plate is configured to support target source material;
   a plurality of recesses formed in the backing plate, wherein each of the plurality of recesses includes a first through-hole portion having a first diameter, and a second through-hole portion having a second diameter; and
   a plurality of self-retained low-friction pads partially disposed in the plurality of recesses, wherein each of the plurality of self-retained low-friction pads includes:
   a solid body portion; and
   a self-retaining stem that extends outward from a bottom of the solid body portion, wherein the self-retaining stem includes a first stem portion disposed in the first through-hole portion, and a second stem portion disposed within the second through-hole portion;
   a support member coupled to the lid proximate an outer end of the support member and extending radially inward; and
   a seal ring disposed between the backing plate and the support member wherein the seal ring is supported by the support member along a bottom surface of the seal ring, and wherein a top surface of the seal ring contacts the target assembly along the bearing surfaces of the plurality of self-retained low-friction pads.

* * * * *